United States Patent [19]

Scheidler et al.

[11] 4,056,765
[45] Nov. 1, 1977

[54] BATTERY-GENERATOR OUTPUT MONITOR

[75] Inventors: Ralph E. Scheidler, Milwaukie; Howard H. Morse, Portland, both of Oreg.

[73] Assignee: Howard H. Morse, Portland, Oreg.

[21] Appl. No.: 623,723

[22] Filed: Oct. 20, 1975

[51] Int. Cl.² ............................................. H02J 7/14
[52] U.S. Cl. ................................. 320/48; 307/10 R; 322/99; 340/249
[58] Field of Search ............... 320/13, 48, 40; 322/99; 317/9 B; 307/10 BP, 10 R; 290/50; 340/249, 248 B

[56] References Cited

U.S. PATENT DOCUMENTS

| | | | |
|---|---|---|---|
| 1,879,530 | 9/1932 | Schaf, Jr. | 340/249 |
| 3,061,827 | 10/1962 | Fiandt et al. | 340/249 |
| 3,321,754 | 5/1967 | Grimm et al. | 320/48 UX |

Primary Examiner—Robert J. Hickey
Attorney, Agent, or Firm—Eugene M. Eckelman

[57] ABSTRACT

The electric potential output from a battery and generator assembly is monitored by three electric indicator circuits, one of which includes a first indicator which is activated to indicate excessively low battery voltage when the normally deactivated transistor switch in said circuit is activated by deactivation of a bias control transistor resulting from deactivation of a zener diode when the output voltage from the assembly drops below a predetermined minimum; a second indicator circuit of which includes a second indicator which is activated to indicate excessively low generator charging voltage when the normally activated transistor switch in parallel with said second indicator is deactivated by deactivation of a zener diode when the output voltage from the generator drops below a predetermined minimum; and a third alarm circuit of which includes a third indicator which is activated to indicate excessively high generator charging voltage when the normally deactivated transistor switch in said third circuit is activated by activation of a zener diode when the output voltage from the generator exceeds a predetermined maximum.

7 Claims, 2 Drawing Figures

BATTERY-GENERATOR OUTPUT MONITOR

BACKGROUND OF THE INVENTION

This invention relates to battery-generator assemblies, and more particularly to a monitor for indicating conditions of excessively high and low output voltage from such assemblies.

Monitoring the output voltage from battery and generator assemblies for excessively high and low voltage serves to alert an operator of impending malfunction of the components of the assembly, as well as other electrical components served by it. For example, when utilized with battery and generator assemblies associated with internal combustion engines, it is effective in alerting the operator of impending malfunctions in the battery, generator (including alternators), voltage regulators, starting motors and soleniod switches therefor.

Generators and alternators, hereinafter encompassed in the term generator, usually fail electrically because of regulator and generator malfunction or overload. Deterioration of voltage regulators causes the generator to operate at too high or too low a voltage. Unless corrected, these conditions ultimately result in damage to the generator and battery. Starting motors also generally deteriorate gradually, resulting in electrical short circuits and open circuits. Starting motor solenoid switches generally fail as a result of excessive arcing brought about by low voltage when starting, or by too much current, caused by faulty starting motor.

Gradual deterioration of batteries also is the usual experience. Usually, one cell of a battery begins to fail, and although it may continue to operate the starting motor, the lowered voltage produces a high amperage condition which results in burning of switches as well as starting motor brushes and commutators. This low voltage condition also results in overloading of the generator because the latter attempts to bring the battery up to proper voltage.

Monitors of various types have been provided heretofore to perform the functions described hereinbefore. They are characterized generally by involving electromechanical relays and other components having mechanical moving parts which are subject to malfunction and consequent false indications. Such systems also are rather bulky, require special mounting to minimize vibrations, and require periodic maintenance and repair.

SUMMARY OF THE INVENTION

In its basic concept, the monitor of this invention involves the control of separate electric indicator circuits by associated separate zener diodes arranged to respond selectively to battery and generator voltages below predetermined minimums and above predetermined maximums.

It is by virtue of the foregoing basic concept that the principal objective of this invention is achieved; namely, to overcome the aforementioned disadvantages and limitations of prior monitors.

Another important objective of this invention is to provide a monitor of the class described which may be arranged to monitor the output of a plurality of batteries.

A further important object of this invention is the provision of a monitor of the class described in which the entire electrical circuitry consists of solid state components, thereby minimizing the size of the monitor and eliminating maintenance and repair.

The foregoing and other objects and advantages of this invention will appear from the following detailed description, taken in connection with the accompanying drawing of preferred embodiments.

DESCRIPTION OF THE PREFERRED EMBODIMENTS

Figure 1:
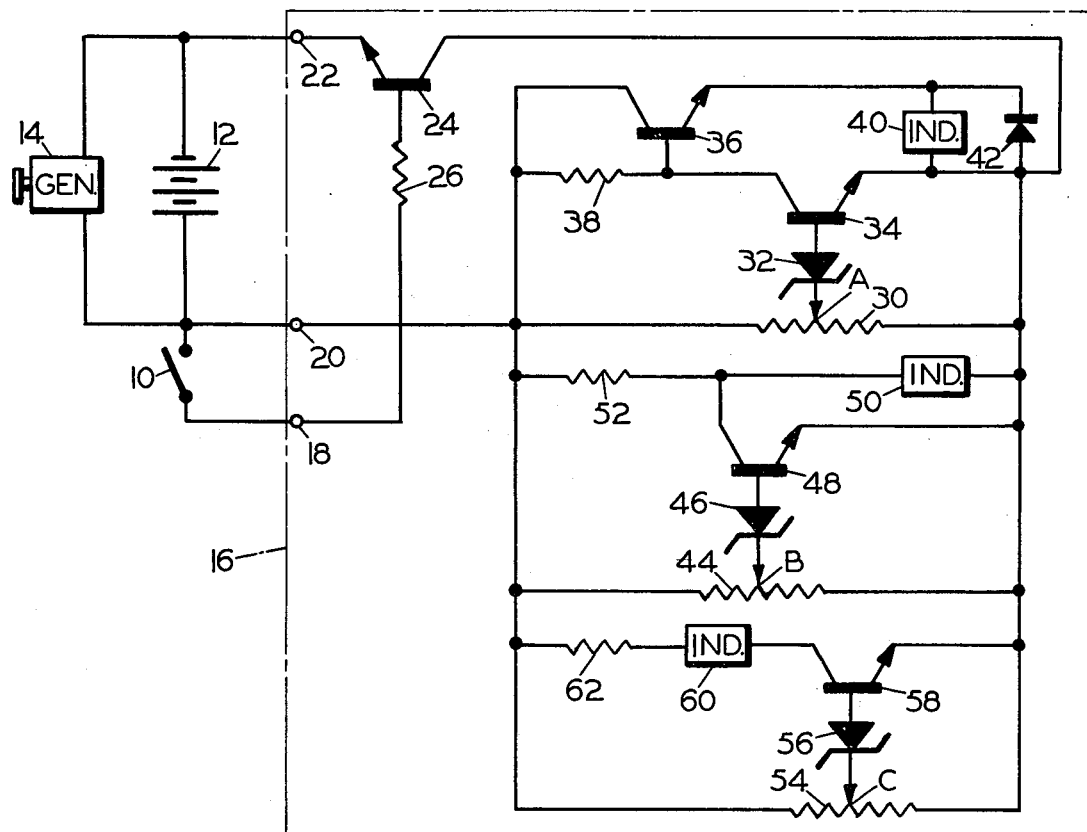
FIG. 1 is a schematic diagram of an electric circuit of a battery-generator output monitor embodying the features of this invention.

Referring first to FIG. 1 of the drawings, the monitor illustrated therein is shown associated with the conventional ignition switch 10, battery 12 and generator 14 conventionally employed with internal combustion engines of automobiles, trucks, tractors, boats and other vehicles, as well as stationary internal combustion engines utilized in a variety of industrial and commercial applications. Thus, the battery may be of any size and the generator may be of any conventional form. In this regard, the term "generator" as employed herein is intended to include alternators, as previously mentioned.

The monitor is shown confined within a housing, indicated by the broken line 16, thus forming a unit arranged for removable attachment to the battery-generator-ignition switch assembly. For this purpose there are provided on the housing an ignition terminal 18, a positive battery terminal 20 and a negative battery terminal 22 for detachable connection of the corresponding conductors leading from the battery and ignition switch.

In the embodiment of FIG. 1, the monitor circuitry is connected to the battery-generator through an electrically actuated switch controlld by the ignition switch. For this purpose the electrically actuated switch illustrated comprises the collector-emitter of a transistor 24, and the actuator therefor includes the base-emitter of the transistor. When the ignition switch is closed, the transistor is turned on through the resistor 26.

The monitor includes means for indicating the adverse condition of the battery voltage dropping too low during the engine cranking operation. In the embodiment of FIG. 1, this is provided by an electric circuit which includes a voltage divider potentiometer 30 which connects the positive battery terminal 20 to a zener diode 32. The diode, in turn, is connected to the base of a transistor 34. The collector-emitter of transistor 34 connects the negative battery terminal 22 to the base of a transistor 36 which is biased normally on by means of resistor 38. The collector-emitter of the transistor 36 function as a switch by which to releasably connect an electrical indicator 40 across the battery. The base-emitter functions as the switch actuator.

The indicator may provide visual and/or audible indication in the form of a warning alarm, when the battery voltage drops too low during the cranking operation of the starting motor.

In this regard, if the voltage at point A of adjustment of potentiometer 30 is above a predetermined value, the zener diode 32 is caused to fire and activate the transistor 34. This, in turn, deactivated the transistor 36, opening its switch and correspondingly deactivating the indicator 40.

However, when the engine is being cranked preliminary to starting, and the voltage at point A drops to the adjusted, predetermined value, for example about 9 volts, the zener diode is turned off, thereby inactivating the transistor 34 and activating the transistor 36. Upon activation of transistor 36, the electric circuit of indicator 40 is completed, and its activation provides a warning to the operator that the battery voltage has dropped too low.

This indicator also warns of other malfunctions. For example, if the starting motor does not crank the engine but the indicator is not activated, it is apparent that the starting motor is open circuited. When the indicator is activated during cranking of the engine, the warning provided thereby may not only indicate that the battery voltage may be in a low state of charge, it may also indicate that the starter motor is drawing too much current. When the battery is in a low state of charge, a high amperage condition obtains that may burn switches as well as starting motor brushes and commutators and may also cause the generator to be overloaded in its attempt to bring the battery up to proper voltage.

Activation of the indicator during cranking of the engine also may indicate that the starter motor is drawing too much current, a condition which may be caused by electrical shorts in the starting motor, or faulty bearings causing the armature to drag on the field coils.

In the event indicator 40 is an electrical buzzer, a diode 42 is connected across it to eliminate voltage spikes during its operation, to protect the transistor 36 against damage.

The monitor also includes means for indicating the adverse condition of the generator not charging sufficiently. In the embodiment illustrated, this is provided by an electric circuit which includes the voltage divider potentiometer 44 which connects the positive battery terminal to a zener diode 46 which, in turn, is connected to the base of a transistor 48. The collector-emitter of the transistor is connected across an indicator 50, and both are connected to the battery terminals 20 and 22 through resistor 52.

The collector-emitter of the transistor 48 functions as an electric switch for releasably shorting the indicator 50 which normally is energized when the ignition key is turned on. The base-emitter of the transistor functions as an actuator for the switch, in the same manner as previously described in connection with transistor 36.

With the engine running, if the generator supplies a voltage at point B which is greater than normal battery voltage but is insufficient to charge the battery, for example about 13 volts, the zener diode 46 is turned off, thereby deactivating the transistor. The transistor switch thus is deactivated, thereby removing the short across the indicator 50 to activate the latter and provide a warning that the generator is not providing sufficient voltage to charge the battery. This generally is caused by malfunctioning of the voltage regulator, generator or slipping drive belt, and it alerts the operator to the necessity of correcting the problem before incurring serious damage to the generator and battery.

In the event the buzzer 40 is replaced by a light emitting diode, the associated circuitry may be modified by omitting the transistor 36 and connecting the light emitting diode in parallel with the emitter-collector of the transistor 34, in the same manner as the light emitting diode 50 and transistor 48 of the second circuit. Thus, the substituted light emitting diode will be activated upon deactivation of the zener diode 32 and the associated transistor 34, when the battery voltage drops below the predetermined value established by the setting of potentiometer 30.

Means also is included in the monitor for providing a warning indication when the generator is producing excessively high charging voltage. Such a condition usually is caused by a faulty regulator, generator, or wiring, and may seriously damage the battery as well as the generator, regulator, lights and other accessories supplies thereby.

In the embodiment illustrated, this indication is provided by an electric circuit which includes the voltage divider potentiometer 54 which connects the positive battery terminal to a zener diode 56. The diode, in turn, is connected to the base of a transistor 58. The collector-emitter of the transistor functions as a switch, actuated by the base-emitter of the transistor, to releasably connect the associated indicator 60 across the battery, through resistor 62.

With the engine running, if the voltage at point C exceeds a predetermined maximum value, higher than normal charging voltage, for example about 15 volts, as established by adjustment of the potentiometer, the zener diode 56 is caused to fire, activating the transistor 58 and the associated indicator 60 to give warning that the generator is providing excessively high charging voltage.

Figure 2:
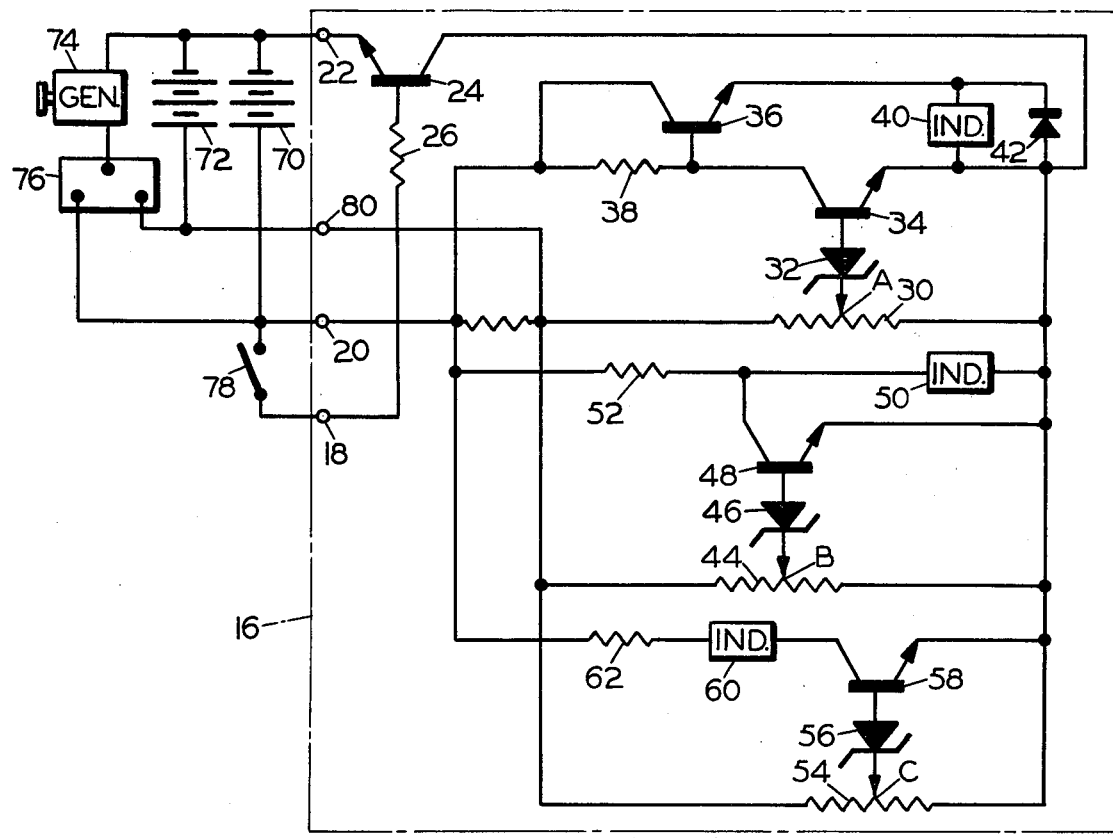
FIG. 2 is a schematic diagram of an electric circuit of a second form of battery-generator output monitor embodying the features of this invention.

FIG. 2 illustrates a modification of the monitor illustrated in FIG. 1, wherein the power source for the electrical indicator circuitry is provided by a battery 70 separate from the battery 72 which is to be monitored. Thus, the arrangement shown in FIG. 2 exemplifies an assembly of a powered vehicle having associated therewith an auxiliary battery 72 intended to operate an electric load which is independent of the vehicle. For example, the auxiliary battery may be employed to supply the power to an electric refrigerator contained in a camper or trailer house carried or towed by the vehicle. Both batteries are connected to the vehicle generator 74 through a conventional isolator 76, as will be understood.

In the embodiment illustrated in FIG. 2, the vehicle battery 70 supplies power to the indicators, upon activation of transistor 24 when the vehicle ignition switch 78 is closed. The positive terminal of battery 72 to be monitored is connected to an additional terminal 80 on the housing 16 and supplies power to the control circuitry in the manner described hereinbefore in connection with FIG. 1.

From the foregoing it will be appreciated that the present invention provides a battery-generator output monitor of extremely simplified and therefore economical construction, which utilizes only solid state circuitry and therefore eliminates the maintenance and possible malfunctioning of the moving parts of mechanial or electro-mechanical components, and which function effectively to provide continuous positive indications of the malfunctioning or the onset of malfunctioning of batteries, generators, regulators, starting motors, solenoid switches and other electrical components, by responding to true voltage of the associated electrical system, thereby contributing significantly to maximizing the useful life of such components.

It will be apparent to those skilled in the art that various changes may be made in the type, number, size and arrangement of components described hereinbefore and to accommodate the monitor to any desired number and sizes of battery-generator assemblies, without departing from the spirit of this invention.

Having now described our invention and the manner in which it may be used we claim:

1. For use with the battery-generator system of an engine having an electric cranking starter, a battery-generator output monitor, comprising:
    a. a first electric circuit including first indicator means for indicating low battery voltage during cranking, and first indicator actuator means having an electric circuit arranged for connection at a first end directly to one of the battery terminals of the battery-generator system and operable when the output voltage drops below a predetermined value during cranking to activate the first indicator means and give indication that the battery voltage drops too low during cranking,
    b. a second electric circuit including second indicator means for indicating low generator charging voltage, and second indicator actuator means having an electric circuit arranged for connection at a first end directly to said one battery terminal and operable when the output voltage drops below a predetermined value higher than the first named predetermined value to activate said second indicator means and give indication that the generator is providing insufficient voltage to charge the battery,
    c. a third electric circuit including third indicator means for indicating high generator charging voltage, and third indicator actuator means having an electric circuit arranged for connection at a first end directly to said one battery terminal and operable when the output voltage exceeds a predetermined maximum to activate said third indicator means and give indication that the generator is producing excessively high charging voltage,
    d. electric control switch means connected at one end to the second end of the electric circuits of the first, second and third indicator actuator means and arranged for connection of its opposite end directly to the other of said battery terminals, and
    e. electric switch actuator means associated with the control switch means and operable upon connection to a source of electric potential to close said control switch means and connect said first, second and third indicator actuator circuits across said battery terminals.

2. The output monitor of claim 1 wherein
    a. the first indicator actuator means comprises first switch means in said first circuit for connecting said first indicator means to a source of electric potential, and first switch actuator means in the electric circuit of the control switch means and operable when the output voltage drops below a predetermined value to activate the first switch means and said first indicator means,
    b. the second indicator actuator means comprises second switch means in said second circuit for connecting said second indicator means to a source of electric potential, and second switch actuator means in the electric circuit of the control switch means and operable when the output voltage drops below a predetermined value higher than the first named predetermined value to activate the second switch means and said second indicator means, and
    c. the third indicator actuator means comprises third switch means in said third circuit for connecting said third indicator means to a source of electric potential, and third switch actuator means in the electric circuit of the control switch means and operable when the output voltage exceeds a predetermined maximum to activate the third switch means and said third indicator means.

3. The output monitor of claim 2 wherein the electric control switch means is connected at said one end to the first, second and third electric circuits.

4. The output monitor of claim 1 wherein
    a. the first indicator actuator means comprises a first switch transistor having its emitter-collector in said first circuit for connecting said first indicator means to a source of electric potential, a first switch actuator transistor having its emitter-collector arranged for connecting the base of the first switch transistor to said source of electric potential, and a first zener diode arranged for connecting the base of the first switch actuator transistor to the battery-generator output circuit and arranged to be activated when the output voltage drops below a predetermined minimum,
    b. the second indicator actuator means comprises a second switch transistor having its emitter-collector connected in parallel with said second indicator means, and a second zener diode arranged for connecting the base of the second switch transistor to the battery-generator output circuit and arranged to be activated when the output voltage drops below a predetermined minimum higher than the first named predetermined minimum, and
    c. the third indicator actuator means comprises a third switch transistor having its emitter-collector in said third circuit for connecting said third indicator means to a source of electric potential, and a third zener diode arranged for connecting the base of the third switch transistor to the battery-generator output circuit and arranged to be activated when the output voltage exceeds a predetermined maximum.

5. The output monitor of claim 4 wherein the electric control switch means is connected at said one end to the first, second and third electric circuits and the first, second and third zener diodes.

6. The output monitor of claim 1 wherein the electric control switch means comprises the emitter-collector of a control switch transistor and the control switch actuator means includes a control switch connecting the base of the control switch transistor to a source of activating electric potential.

7. The output monitor of claim 6 wherein the control switch comprises the ignition switch of an internal combustion engine associated with the battery-generator output to be monitored.

* * * * *